United States Patent [19]

Thaler

[11] Patent Number: 4,464,009
[45] Date of Patent: Aug. 7, 1984

[54] SOLDERLESS CONNECTOR PIN FOR ELECTRICAL CIRCUITS

[76] Inventor: Hartmuth F. Thaler, Hohe Strasse 15, D-7110 Ohringen, Fed. Rep. of Germany

[21] Appl. No.: 377,485

[22] Filed: May 12, 1982

Related U.S. Application Data

[63] Continuation-in-part of Ser. No. 302,920, Sep. 16, 1981, abandoned.

[30] Foreign Application Priority Data

Mar. 2, 1981 [DE] Fed. Rep. of Germany ....... 3107906
May 13, 1981 [EP] European Pat. Off. ........ 81103663.1
Feb. 27, 1982 [EP] European Pat. Off. ........ 82101521.1

[51] Int. Cl.$^3$ ............................................. H01R 4/28
[52] U.S. Cl. .............................. 339/252 R; 339/17 C; 339/220 R; 339/221 R
[58] Field of Search ............ 339/17 C, 221 R, 221 M, 339/220 R, 252 R

[56] References Cited

U.S. PATENT DOCUMENTS

| 3,465,279 | 9/1969 | Krehbiel | 339/176 M |
| 3,783,433 | 1/1974 | Kurtz et al. | 339/17 C |
| 3,824,554 | 7/1974 | Shoholm | 339/221 R |
| 3,975,078 | 8/1976 | Ammon | 339/221 M |
| 4,223,970 | 9/1980 | Walter | 339/220 R |
| 4,274,699 | 6/1981 | Keim | 339/220 R |

Primary Examiner—John McQuade
Assistant Examiner—Gary F. Paumen
Attorney, Agent, or Firm—Pollock, Vande Sande & Priddy

[57] ABSTRACT

A connector pin, adapted to be inserted into a metallized bore in a conductive plate to form a solder-free mechanical and electrical connection between the pin and plate, is fabricated to provide an elongated deformable region adapted to engage the sides of the bore and consisting of two elongated beam members that are inteconnected to one another by a cross member. The cross section of the resulting deformable region may be M-shaped or W-shaped. Upon insertion of the pin into the bore, the deformable region deforms elastically and, in the case of a small diameter bore, partially plastically to provide a good electrical and mechanical connection between the pin and plate.

7 Claims, 9 Drawing Figures

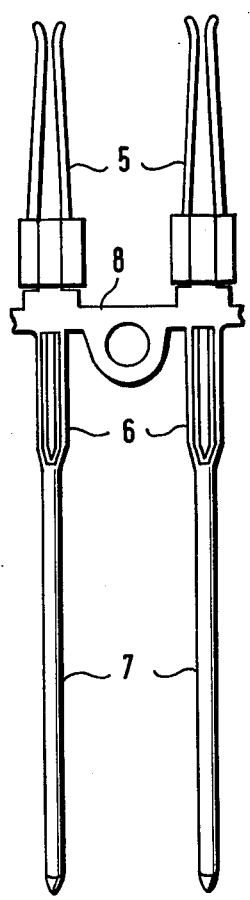
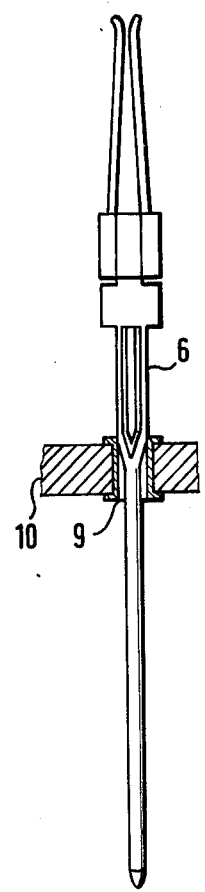
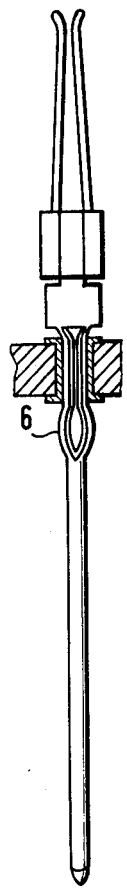
FIG. 1   FIG. 2   FIG. 3
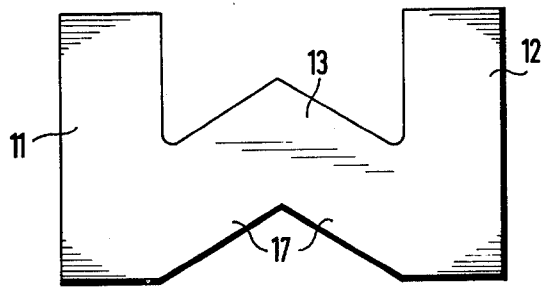
FIG. 4

SOLDERLESS CONNECTOR PIN FOR ELECTRICAL CIRCUITS

CROSS REFERENCE TO RELATED APPLICATION

This application is a continuation-in-part of applicant's prior copending U.S. application Ser. No. 302,920 filed Sept. 16, 1981, for "Solderless Connector Pin for Electrical Circuits", now abandoned.

BACKGROUND OF THE INVENTION

The present invention is concerned with connector pins that are adapted to be pushed into a metallized bore formed in at least one electrically conductive plate, to produce a solder-free connection between the pin and the plate. The form of pin with which the present invention is particularly concerned is one wherein the pin has a deformable region, adapted to engage the sides of the bore in the conductive plate, consisting of two spaced and generally parallel beam members the outer edges of which are adapted to mechanically and electrically engage the walls of the bore.

Connector pins, adapted to be pressed or pushed into a bore in a conductive plate, have been suggested heretofore. In one known configuration, the pin is provided with a region that is substantially square or rectangular in cross section and which is intended, when the pin is inserted into the metallized bore of a conductor plate, to engage at its outer edges the metallized wall of the bore. Since the bore diameter and the cross sectional dimensions of the aforementioned region of the pin vary, a secure contact between the pin and bore walls is not always attainable. This is particularly true when a single pin is pressed through aligned bores in a plurality of superposed conductor plates. Moreover, when a pin is so pressed through the bores of superposed conductor plates, it is normally intended that the pin not only make electrical connection to each of said plates but that, in addition, it should act to hold the plates together mechanically; and such a mechanical connection cannot be assured due to the aforementioned dimensional variations.

So-called AMP pins have been suggested in which the region of the pin that is adapted to engage the walls of the bore consists of two parallel beam-shaped elements which are separated from one another and partly overlap one another adjacent the middle of the pin. When such a pin is pressed into the bore of a conductor plate, the beam-shaped members move relative to one another whereby relatively large dimensional variations of the bore can be compensated by this particular region of the pin. A disadvantage of this particular structural arrangement, however, is that only two outer edges of the contact region of the pin, lying diagonally opposite one another, engage the wall of the bore. Since each beam-shaped element is, in effect, clamped in position at its opposing ends in the direction of the axis of the pin, and since each beam-shaped element accordingly bends when the pin is inserted into the bore of a plate, problems can occur with respect to the reliability of the mechanical or electrical connection that is achieved at the contact zone of the pin, particularly in those cases where the pin is inserted through a plurality of superposed conductor plates.

In another known form of connector pin, the contact zone of the pin consists of a tube that is slotted lengthwise. When such a pin is pressed into the bore of a conductor plate, the arc-shaped portions of the contact zone bend inwardly. As a result, a region of substantially flat contact exists between the wall of the bore and the side walls of the tubular section, and this tends to impair the transition resistance between the pin and bore when the bore wall and/or the surface of the contact region of the pin has a layer of increased ohmic resistance. More particularly, in this particular arrangement the metallized layer of the bore wall is not penetrated by any portion of the contact region of the pin. This problem becomes particularly pronounced when the pin is to be inserted through a plurality of superposed conductor plates inasmuch as, in such an arrangement, good electrical and/or mechanical connection between the pin and all of these plates cannot be assured.

A still further arrangement is disclosed in European Pat. No. 5,356 (corresponding to Keim U.S. Pat. No. 4,274,699) wherein a pin is provided with thick, non-deformable outer zones having an exterior arcuate contour which corresponds to the inner contour of the bore that receives the pin. These outer zones are connected to one another by a thin cross piece which is plastically deformed and/or sheared off when the pin is set into the bore. The arcuate exterior of the outer zones lies against the wall of the bore without, however, penetrating the tin layer of the wall of the bore; and this arrangement therefore again results in the problems discussed above. Moreover, the complete plastic deformation or shearing off of the cross piece is especially disadvantageous, since this results in a loss of the elasticity needed to securely press the outer contour of the outer zones of the pin against the wall of the bore after the pin has been set into the bore. This disadvantage becomes particularly pronouned if any mechanical loading is applied to the pin and/or if the pin or bore are subject to vibratory stresses. The pin of this particular arrangement is also unsuitable for connecting two or more conductor plates together since insertion of the pin into the bore of a first conductor plate causes the complete plastic deformation or shearing off of the cross piece, and the pin cannot therefore firmly engage the bore of a second conductor plate unless the bore in the second plate has a diameter less than the diameter of the bore in the first conductor plate.

The present invention is intended to avoid these problems in the prior art by providing a pin configuration which can compensate for variations of tolerance of the bore and/or contact zone of the pin, thereby to always assure an excellent electrical and mechanical connection between the pin and conductor plate regardless of whether the pin is to be inserted into a single plate or through a plurality of superposed conductor plates.

SUMMARY OF THE INVENTION

In accordance with the present invention, an elongated connector pin, fabricated of electrically conductive material and adapted to be pressed into a metallized bore in at least one electrically conductive plate to make a solder-free electrical connection between the pin and the plate, has an elongated deformable region that is located between the opposing ends of the pin. This deformable region is adapted to mechanically and electrically engage the side walls of the bore in the plate to effect the desired connection between the pin and plate, and comprises a pair of spaced substantially parallel, elastically deformable beam members that extend in the direction of elongation of the pin and that are interconnected to one another by a deformable cross member having a thickness which is substantially equal to, but which may be less than or greater than, the thickness of either of the beam members. The cross member is integral with each of the beam members, is disposed between the pair of beam members, and functions, when the pin is pressed into the bore of a conductor plate, to be deformed mainly elastically, and in the case of small bore diameters partially plastically.

The elastically deformable outer beam members cooperate with the intervening deformable cross member to assure that the outer edges of the beam members penetrate the metallized layer of the bore wall and come into direct contact with the copper wall of the bore. This results in four gas-tight, vibration-proof contact regions between the pin and the plate, located respectively at the four outer corners of the two spaced beam members. When the pin is inserted into a bore having a diameter smaller than that of a standard bore, the outer zones of the deformable region, i.e., the beam members, are elastically deformed and, in the extreme case, take on an outer contour which corresponds approximately to the inner contour of the bore wall. Moreover, when the elongated deformable region of the pin is inserted through the aligned bores of a plurality of superposed conductor plates, the elastic deformability of the beam members and cross member assures an excellent mechanical and electrical connection between the pin and the bores of each plate since, in effect, the deformation of the pin within the bore of each plate is individually tailored to the dimensional conditions existing in that particular bore.

BRIEF DESCRIPTION OF THE DRAWINGS

The foregoing objects, advantages, construction and operation of the present invention will become more readily apparent from the following description and accompanying drawings wherein:

FIG. 1 depicts a pair of interconnected pins, as fabricated, constructed in accordance with the present invention;

FIG. 2 depicts a connector pin of the type shown in FIG. 1 with the contact region thereof about to be inserted into the bore of a conductor plate;

FIG. 3 shows the pin/plate arrangement of FIG. 2 with the pin inserted into position;

FIG. 4 is an enlarged cross section of the deformable region of a connector pin constructed in accordance with one embodiment of the present invention;

DESCRIPTION OF THE PREFERRED EMBODIMENTS

Figure 5:
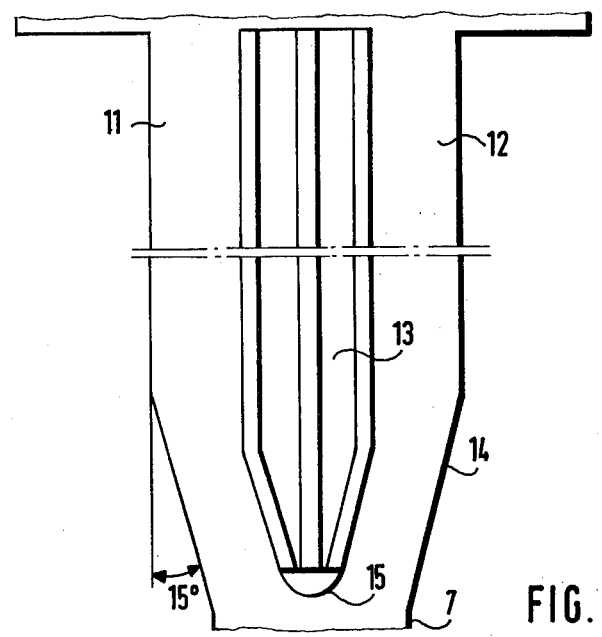
FIG. 5 is a side view of the deformable pin region shown in FIG. 4.

Referring initially to FIG. 1, a plurality of contact pins constructed in accordance with the present invention may be fabricated by stamping the same out of a strip of electrically conductive material. Each pin is provided with a spring contact 5 at its upper end, a deformable region or contact zone 6, and an elongated wire wrap post 7 one end of which merges smoothly into one end of the deformable region 6 via a conically shaped transition portion of the pin. Following the stamping of the plurality of pins from the strip material, the deformable region or contact zone 6 of the pin is then formed by a further stamping operation, whereafter the interconnecting pieces 8, extending between the several pins and having a positioning bore therein, are separated from the pins themselves to provide a plurality of pins each of which, individually, has the configuration shown for example in FIG. 2.

Such a pin can be set into the bore 9 of a conductor plate 10 by inserting the wire wrap post 7 of the pin through the bore 9 until the deformable region 6 engages the top of the bore (see FIG. 2) and by thereafter applying further forces to the pin to press the deformable region 6 into and through the bore as shown in FIG. 3. As will be apparent from a comparison of FIGS. 2 and 3, and as shown particularly by the bulge below the bore in FIG. 3, when the pin has been fully pressed into position the contact region 6 is elastically deformed.

As shown in FIGS. 4 and 5, the deformable region 6 of the pin may, in accordance with one embodiment of the invention, be substantially M-shaped in cross section, this cross section being defined by two spaced, elastically deformable, substantially parallel, beam members 11, 12 which extend in the direction of elongation of the pin and which are interconnected to one another by a substantially V-shaped elastically deformable cross member 13. Cross member 13 consists of a pair of legs 17 which are integral with one another, and each of which is integral with an associated one of the beams 11, 12. The thickness of the cross member 13 is substantially equal to the thickness of each of the beam members 11, 12, but may be thinner or thicker than that of the beam members in some embodiments of the invention.

As shown in FIG. 5, the lower ends of the beam members 11, 12 and of the cross member 13, are tapered to provide a substantially conical transition zone 14 between the deformable region of the pin and the wire wrap post 7. The angle of this conical transition portion is about 15°. In the transition region 14, the cross piece 13 is tapered downward in an approximately wedge-shaped configuration, and it can be terminated if desired in a smooth radius 15 although a rectangular closure of the cross member 13 is preferred.

Figure 6:
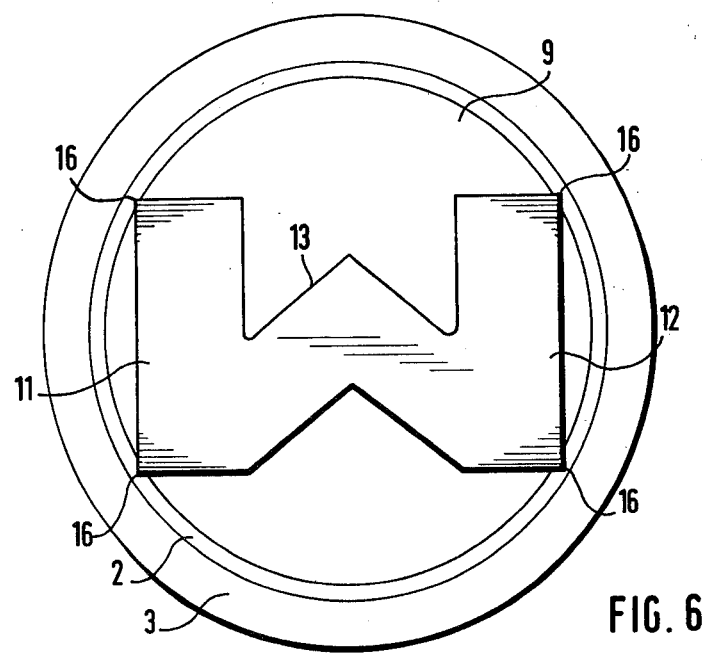
FIG. 6 is a cross section through a conductor plate bore of standard dimension, having a pin of the type shown in FIGS. 4 and 5 inserted therein.

FIG. 6 shows the configuration of the deformable region 6 when the pin has been fully set into a bore 9 of rated or standard size in plate 10. As the pin is pressed into place, the four outer corners 16 of beam members 11, 12 penetrate the tinned or metallized layer 2 of the bore wall and come into contact with the copper wall 3 of bore 9. The cross member 13 is elastically deformed, and beam members 11, 12 are also elastically deformed but to a lesser extent than cross piece 13. The elastic deformation of the cross piece 13 and the outer zones of the deformable region, i.e., beams 11, 12, stores mechanical energy and produces the necessary contact pressure to assure satisfactory and continuing contact between edges 16 of the beam members and the side walls of the bore. The relatively large elastic component of the deformation compensates for the dimensional tolerances which may occur in the bore, as will be explained later. The four corners 16 of the beam members dig into the metallized layer 2, and contact the copper sheath 3, as noted above, and cause the copper sheath 3 to be slightly deformed by corners 16 but not cut through. As a result, the inner stresses which occur in the conductor plate 10 are relatively slight. Secure contact is assured through the storing of energy in the elastic zones of the pin as well as the bore 9.

In the embodiment of the invention shown in FIG. 4, when the pin is inserted into a bore the elastic deformation of the cross piece 13 tends to cause the upper ends (as illustrated, i.e., in cross section) of the beams 11, 12 to bend outwardly. However, the elasticity of the beams 11, 12 in contact with the wall of the bore, causes the upper ends of the beams or legs 11, 12 to be pressed back toward one another so that the distance between the upper corners 16 is substantially equal to that between the lower corners 16 as shown in FIG. 6.

Figure 7:
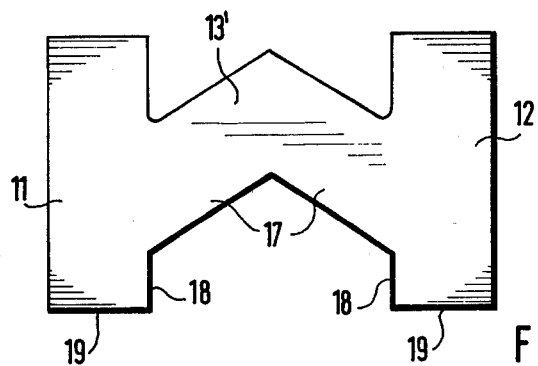
FIG. 7 is a cross section through the deformable region of a second embodiment of the present invention.

The modified form of the invention shown in FIG. 7 is similar to that described above, is again M-shaped in cross section, and comprises a pair of beam members 11, 12 which are interconnected to one another by a V-shaped cross piece 13'. In the form shown in FIG. 7, however, the legs 17 of cross piece 13' merge into their associated beam members at positions which are located between and spaced from the opposing transverse edges of the beam members, i.e., in contrast to the FIG. 4 arrangement, the legs 17 of the cross piece 13' shown in FIG. 7 are spaced from the transverse edges 19 of the beams 11, 12 by a distance 18. In the FIG. 7 embodiment of the invention, as well as in the FIG. 4 embodiment, the cross-sectional length of each beam member 11, 12 is about 2.5 times the thickness of said beam member, the legs 17 of the cross piece 13 (or 13', as the case may be) are oriented at angles of approximately 60° to their respective beams 11, 12, and the said legs 17 are disposed at an angle of substantially 120° to one another. The cross pieces 13 and 13' are, in each case, equal in thickness to the beam members 11, 12, but may also be thinner. The width of the cross piece 13 or 13' between the beam members 11, 12 may be about equal to the total thickness of the beam members 11, 12.

As mentioned above, the pressing together of the cross piece in the embodiment of FIG. 4, when the pin is inserted into a bore, tends to spread the upper ends (as illustrated) of legs or beams 11, 12 outwardly relative to one another, whereby the cross section of the deformable zone of the pin tends to assume a W-shape. Nevertheless, when the pin is pressed into place the M-shape is substantially retained because of the elasticity of the zones 11, 12, which act as a support that is clamped below and loaded above, and which has the tendency to adapt the configuration of the deformable zone to the wall of the bore 9. Much the same operation occurs in the embodiment of FIG. 7, i.e., pressing together of the cross piece 13' tends to cause the upper free ends of the legs 11, 12 to bend outwardly; but since the legs 17 of cross piece 13' originate at middle portions of the zones 11, 12, these zones 11, 12 act as a support in the middle of the deformable region, which support is loaded at both ends, i.e., adjacent the edges 16.

Figure 8:
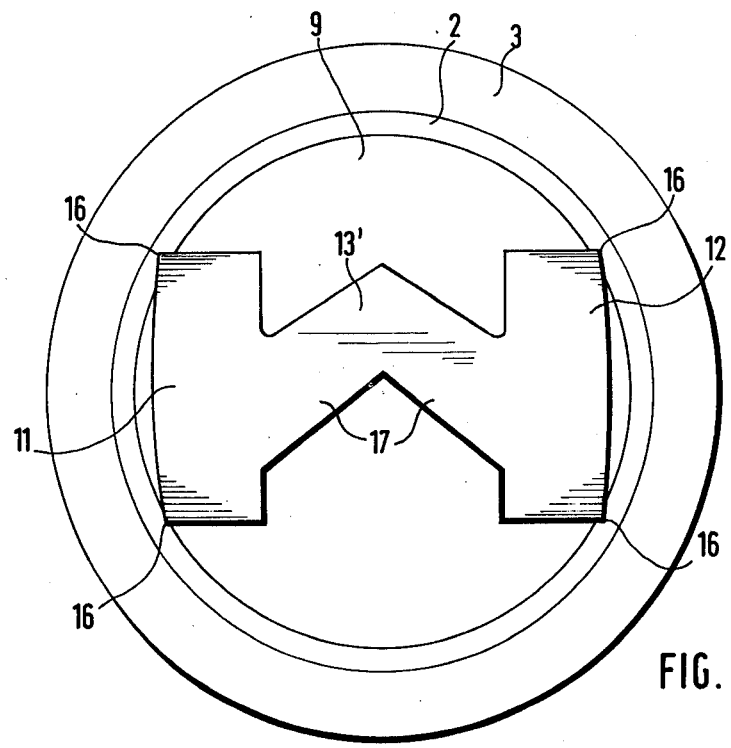
FIG. 8 is a cross section through a conductor plate bore of over-size diameter, having a pin of the type shown in FIG. 7 inserted therein.

As can be seen from FIG. 8, the corners 16 grip uniformly into the conductive layer 2 of bore 9, even when the bore 9 is over-size. When the pin is pressed into place the cross piece 13' is elastically deformed, and the angle between the legs 17 becomes less than 120°. There is also an elastic deformation of the zones 11, 12, with the deformation in the upper portion of each of these zones being less than that in the lower portion of the respective zone. Since this causes the zones 11, 12 to act as a support in the middle of the deformable region, as described above, which is loaded adjacent the corners 16, there is a preferential tendency for the outer contour of the zones 11, 12 to adapt to the inner contour of the bore 9 (see FIG. 8) even when the bore 9 is over-size.

Figure 9:
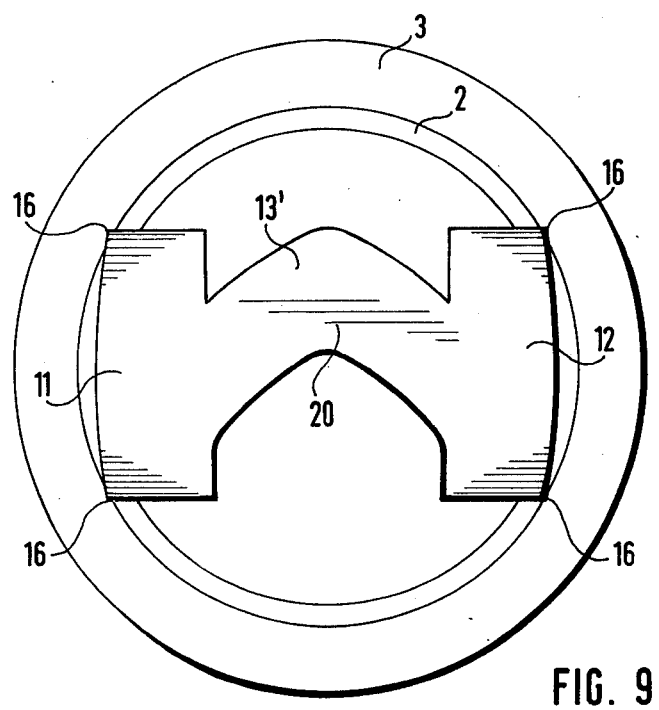
FIG. 9 is a cross section similar to that of FIG. 8, wherein the bore is of under-size diameter.

If a pin having the cross section shown in FIG. 7 is pressed into a under-size bore 9, as shown in FIG. 9, the cross piece 13', in addition to being elastically deformed, is plastically deformed to a limited extent. This plastic deformation takes place mainly at the apex 20 of the V-shape cross piece 13'. The zones 11, 12 of the pin are, in this case, deformed elastically to a greater extent than in the case of an over-size bore (FIG. 8) or a standard bore (FIG. 6) with the result that the edges 16 penetrate completely through the conductive layer 2 and into the copper tube 3. Thus the entire outer periphery of the zones 11, 12 comes into contact with the conductive layer 2, while the covers 16 come into contact with copper tube 3.

As mentioned previously, the thickness of the cross pieces 13 and 13' is preferably equal to that of the zones 11, 12. Pin configurations having such equal thicknesses are especially suitable for joining several conductor plates 10 together through their respective bores 9. If desired, however, the cross piece 13 or 13' may be thicker than the outer zones 11, 12. On the other hand, if the pin is to be set into a thin plate having a tight bore, then it is preferable that the cross piece 13 or 13' be thinner than the outer zones 11, 12. In any of these arrangements, the pin is produced by a stamping operation as previously described; and in the form of the invention shown in FIG. 7, it has been found especially advantageous to make the displacement of material of the lower V-shaped stamping equal to the material displacement of the upper W-shaped stamping, i.e., the stamping by which the cross piece 13' is formed.

Having thus described my invention, I claim:

1. An elongated connector pin fabricated of an electrically conductive material and adapted to be pressed into a metallized bore in at least one electrically conductive plate thereby to make a solder-free electrical connection between the pin and plate, said pin having an elongated deformable region of M-shaped cross section located between the opposing ends of said pin, said deformable region comprising a pair of spaced substantially parallel, elastically deformable beam members extending in the direction of elongation of said pin and interconnected to one another by an elastically deformable cross member of substantially V-shaped cross section, said deformable cross member being integral with each of said elastically deformable beam members and being disposed between said pair of beam members to provide said M-shaped deformable region, said pair of beams defining four outer corners which are adapted to mechanically penetrate and electrically contact the metallized side walls of the bore in the plate as a result of the elastic forces generated within said beam members and cross member when said connector pin is pressed into said bore, thereby to effect said connection.

2. The connector pin of claim 1 wherein said V-shaped cross member has a pair of legs which are oriented at substantially 120° to one another, each of said legs merging into one of said beam members respectively at an angle of substantially 60° to said beam member.

3. The connector pin of claim 2 wherein each of said beams includes a pair of opposing transverse edges, each of said legs merging into its associated beam member at a position located between and spaced from the opposing transverse edges of said beam member.

4. The connector pin of claim 1 wherein the thickness of said cross member is substantially equal to the thickness of each of said beam members.

5. The connector pin of claim 1 wherein the width of said cross member between said beam members is substantially equal to the combined thicknesses of said beam members.

6. The connector pin of claim 1 wherein the cross-sectional length of each of said beam members is substantially 2.5 times the cross sectional thickness of said beam member.

7. The connector pin of claim 1 wherein one end of said pin comprises an elongated wire-wrap post, said post merging into one end of said deformable region via a conical transition portion of said pin.

* * * * *